(12) United States Patent
Torii (10) Patent No.: US 9,627,519 B2
(45) Date of Patent: Apr. 18, 2017

(54) SEMICONDUCTOR DEVICE (71) Applicant: Sanken Electric Co., Ltd., Niiza-shi, Saitama (JP)

(72) Inventor: Katsuyuki Torii, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 14/912,621

(22) PCT Filed: Jan. 14, 2015

(86) PCT No.: PCT/JP2015/050772
§ 371 (c)(1),
(2) Date: Feb. 18, 2016

(87) PCT Pub. No.: WO2015/141257
PCT Pub. Date: Sep. 24, 2015

(65) Prior Publication Data
US 2016/0204236 A1    Jul. 14, 2016

(30) Foreign Application Priority Data
Mar. 19, 2014 (JP) .................................. 2014-056056

(51) Int. Cl.
*H01L 29/739* (2006.01)
*H01L 29/36* (2006.01)
(Continued)

(52) U.S. Cl.
CPC .......... *H01L 29/7397* (2013.01); *H01L 29/36* (2013.01); *H01L 29/732* (2013.01);
(Continued)

(58) Field of Classification Search
CPC . H01L 29/1095; H01L 29/36; H01L 29/7397; H01L 29/732; H01L 29/0847; H01L 29/739

See application file for complete search history.

(56) References Cited

U.S. PATENT DOCUMENTS 9,385,211 B2* 7/2016 Miyazaki .............. H01L 21/265
2002/0195656 A1* 12/2002 Hattori ................ H01L 29/7397
257/330

(Continued)

FOREIGN PATENT DOCUMENTS

JP    2007-266133 A    10/2007
JP    2013-247248 A    12/2013

(Continued)

*Primary Examiner* — Karen Kusumakar
(74) *Attorney, Agent, or Firm* — MOTS LAW, PLLC (57) ABSTRACT

A semiconductor device includes: a first conductivity-type collector region; a second conductivity-type field stop region disposed on the collector region; a second conductivity-type drift region, which is disposed on the field stop region and has an impurity concentration lower than the field stop region; a first conductivity-type base region disposed on the drift region; and a second conductivity-type emitter region disposed on the base region, wherein an impurity concentration gradient in a film thickness direction of the field stop region is larger in a region adjacent to the collector region than in a region adjacent to the drift region.

4 Claims, 8 Drawing Sheets (51) Int. Cl.
*H01L 29/732* (2006.01)
*H01L 29/08* (2006.01)
*H01L 29/10* (2006.01)

(52) U.S. Cl.
CPC ........ H01L 29/739 (2013.01); *H01L 29/0847* (2013.01); *H01L 29/1095* (2013.01)

(56) References Cited

U.S. PATENT DOCUMENTS

2012/0267681 A1* 10/2012 Nemoto ................ H01L 21/263
257/139
2014/0070268 A1* 3/2014 Yoshimura .......... H01L 29/0834
257/139

FOREIGN PATENT DOCUMENTS

| WO | 2012/157772 A1 | 11/2012 |
| WO | 2013/141181 A1 | 9/2013 |

* cited by examiner

FILM THICKNESS DIRECTION

SEMICONDUCTOR DEVICE

TECHNICAL FIELD

The present invention relates to a semiconductor device having a field stop region.

BACKGROUND ART

An insulated gate bipolar transistor (IGBT) has a high input impedance and a low ON voltage, and accordingly, is used in a motor drive circuit and the like. For the IGBT, a structure in which a field stop region is disposed between a drift region and a collector region is adoptable (for example, refer to Patent Literature 1). By the field stop region, a depletion layer that extends from an upper surface of the drift region is prevented from reaching the collector region at an OFF time.

CITATION LIST

Patent Literature

[PTL 1] Japanese Patent Laid-Open Publication No. 2013-247248

SUMMARY OF INVENTION

Technical Problem

When the depletion layer that extends from the drift region to the collector region reaches the field stop region at the OFF time of the IGBT, an extension ratio of the depletion layer decreases suddenly. In such a way, there has been a problem that ringing occurs in a voltage rise waveform at the OFF time of the IGBT.

In consideration of the above-described problem, it is an object of the present invention to provide a semiconductor device which has a field stop region, and in which the occurrence of ringing in the voltage rise waveform at the OFF time is suppressed.

Solution to Problem

In accordance with an aspect of the present invention, a semiconductor device is provided which includes: a first conductivity-type collector region; a second conductivity-type field stop region disposed on the collector region; a second conductivity-type drift region, which is disposed on the field stop region and has an impurity concentration lower than the field stop region; a first conductivity-type base region disposed on the drift region; a second conductivity-type emitter region disposed on the base region; a gate insulating film disposed between the drift region and the emitter region so as to face to the base region; and a gate electrode disposed via the gate insulating film so as to be opposed to the base region, wherein an impurity concentration gradient in a film thickness direction of the field stop region is larger in a region adjacent to the collector region than in a region adjacent to the drift region.

Advantageous Effects of Invention

In accordance with the present invention, there can be provided the semiconductor device, which has the field stop region, and in which the occurrence of ringing in the voltage rise waveform at the OFF time is suppressed.

DESCRIPTION OF EMBODIMENT

Next, a description is made of an embodiment of the present invention with reference to the drawings. In the following description referring to the drawings, the same or similar numerals are assigned to the same or similar portions. However, the drawings are schematic, and it should be noted that a relationship between a thickness and a planar dimension, a length ratio of the respective portions, and the like are different from actual ones. Hence, specific dimensions should be determined in consideration of the following description. Moreover, as a matter of course, portions different in mutual dimensional relationships and ratios are incorporated also among the drawings.

Moreover, the embodiment described below illustrates an apparatus and a method, which are for embodying the technical idea of this invention, and the technical idea of this invention does not specify shapes, structures, arrangements and the like of constituent components to those in the following description. The embodiments of this invention can be modified in various ways within the scope of claims.

Figure 1:
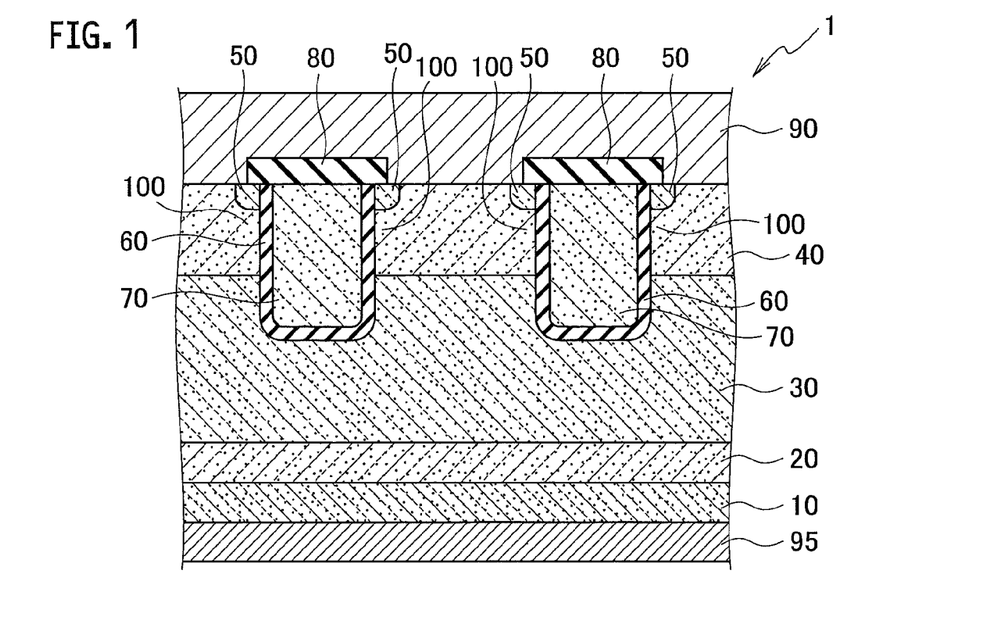
FIG. 1 is a cross-sectional view showing a structure of a semiconductor device according to an embodiment of the present invention.

A semiconductor device 1, according to the embodiment of the present invention is an insulated gate bipolar transistor (IGBT), and as shown in FIG. 1 includes: a first conductivity-type collector region 10; a second conductivity-type field stop region 20 disposed on the collector region 10; a second conductivity-type drift region 30, which is disposed on the field stop region 20 and has an impurity concentration lower than the field stop region 20; a first conductivity-type base region 40 disposed on the drift region 30; and second conductivity-type emitter regions 50 disposed on the base region 40. A plurality of the emitter regions 50 is selectively embedded in a part of an upper surface of the base region 40. Note that, though details will be described later, an impurity concentration gradient in a film thickness direction of the field stop region 20 is set larger in a region adjacent to the collector region 10 than in a region adjacent to the drift region 30.

The first conductivity type and the second conductivity type are conductive types opposite to each other. That is to say, if the first conductivity type is the n-type, then the second conductivity type is the p-type, and if the first conductivity type is the p-type, then the second conductivity type is the n-type. An illustrative description is made below of a case where the first conductivity type is the p-type and the second conductivity type is the n-type.

The semiconductor device 1 further includes: gate insulating films 60 arranged between the drift region 30 and the emitter regions 50 so as to face the base region 40; and gate electrodes 70 arranged via the gate insulating films 60 so as to be opposed to the base region 40. Front surfaces of the base region 40, which are opposed to the gate electrodes 70, are channel regions 100.

The semiconductor device 1 shown in FIG. 1 has a trench gate structure. That is to say, trenches are formed, which extend from upper surfaces of the emitter regions 50 and penetrate the emitter regions 50 and the base region 40. The gate insulating films 60 are arranged on inner walls of the trenches, and the gate electrodes 70 are embedded in insides of the trenches via the gate insulating films 60.

On upper surfaces of the gate electrodes 70, interlayer insulating films 80 are arranged. Above the gate electrodes 70 via the interlayer insulating films 80, an emitter electrode 90 is disposed, connecting to the base region 40 and the emitter regions 50. By the interlayer insulating films 80, the gate electrodes 70 and the emitter electrode 90 are electrically insulated from each other. Moreover, a collector electrode 95 is disposed on the other principal surface of the collector region 10, which is opposed to the one principal surface in contact with the field stop region 20.

Below, a description is made of operations of the semiconductor device 1. A predetermined collector voltage is applied between the emitter electrode 90 and the collector electrode 95, and a predetermined gate voltage is applied between the emitter electrode 90 and the gate electrodes 70. For example, the collector voltage is approximately 300 V to 1600 V, and the gate electrode is approximately 10 V to 20 V. When the semiconductor device 1 is turned to an ON state as described above, the channel region 100 is inverted from the p-type to the n-type, and a channel is formed. Passing through the formed channel, electrodes are implanted from the emitter electrode 90 to the drift region 30. By the implanted electrodes, a forward bias is applied between the collector region 10 and the drift region 30, and holes move from the collector electrode 95 via the collector region 10 sequentially to the drift region 30 and the base region 40. Moreover, when a current is gradually increased, the electrons coming from the collector region 10 are increased, and the holes are accumulated below the base region 40. As a result, an ON voltage decreases due to conductivity modulation.

In a case of turning the semiconductor device 1 from the ON state to the OFF state, the gate voltage is lowered more than a threshold voltage. For example, the gate voltage is controlled to be the same potential as an emitter voltage or to be a negative potential for the emitter voltage, whereby the channel is extinguished. In such a way, the implantation of the electrons from the emitter electrode 90 to the drift region 30 is stopped. Since a potential of the collector electrode 95 is higher than that of the emitter electrode 90, a depletion layer spreads from an interface between the base region 40 and the drift region 30, and in addition, the holes accumulated in the drift region 30 come out thereof to the emitter electrode 90.

At the time when the IGBT is OFF, the depletion layer extends from an upper surface of the drift region 30 toward the collector region 10 as described above. By the field stop region 20, the depletion layer is prevented from reaching the collector region 10. An impurity concentration of the field stop region 20 is high in a collector region side, and is low in a drift region side. In order that punch through in which the depletion layer reaches the collector region 10 cannot occur, some thickness and a total electron quantity to some extent are required for the field stop region 20.

Figure 2:
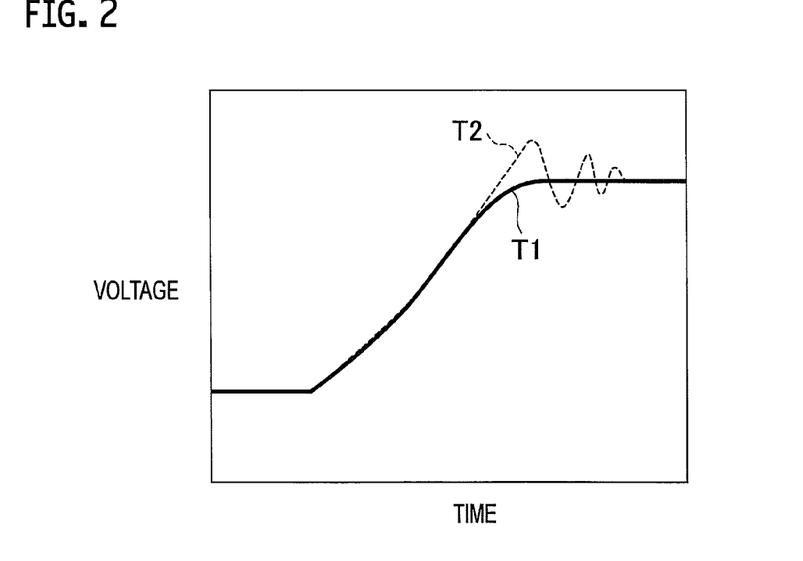
FIG. 2 is a schematic graph showing waveforms of rise voltages at an OFF time in the semiconductor device according to the embodiment of the present invention and in a comparative example.

However, in a case where the impurity concentration gradient in the film thickness direction of the field stop region 20 when viewed from the drift region side is steep, such a problem as follows occurs. That is to say, when the depletion layer that spreads from the drift region 30 at the time when the IGBT is OFF reaches the field stop region 20, an extension ratio of the depletion layer with respect to the voltage decreases suddenly. As a result, in a voltage rise waveform at the OFF time, there occurs such ringing as shown as a characteristic T2 in FIG. 2.

In an instrument that mounts thereon an IGBT in which such ringing occurs, a variety of problems occur. For example, in an electromagnetic wave interference (EMI) test such as a noise terminal voltage test, ringing at a switching time is propagated to an outlet, and a voltage of a specified value or more is generated. Therefore, some measures are required to satisfy specifications of the EMI test, and there occurs such a problem that a cost increase is brought about.

In opposition to this, in the semiconductor device 1 according to the embodiment of the present invention, the field stop region 20 is formed so that the impurity concentration gradient in the film thickness direction can be gentle. Therefore, the extension ratio of the depletion layer with respect to the voltage becomes gently small. As a result, as shown as a characteristic T1 in FIG. 2, the ringing is suppressed from occurring in the voltage rise waveform at the OFF time.

Figure 3:
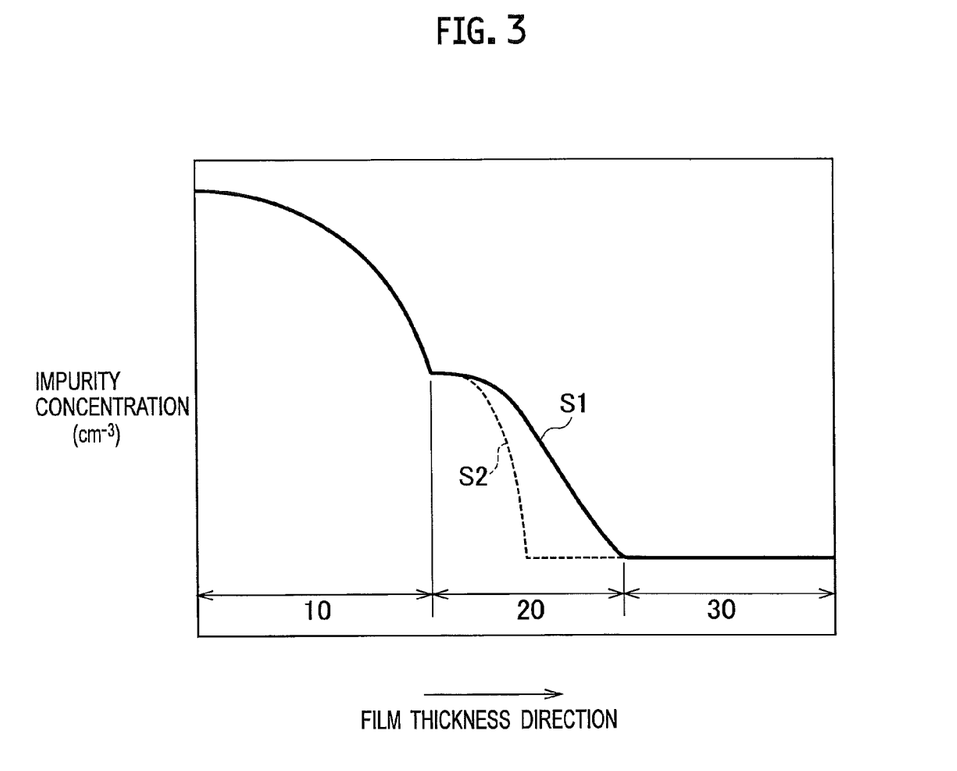
FIG. 3 is a schematic diagram showing an example of an impurity concentration profile of the semiconductor device according to the embodiment of the present invention.

FIG. 3 shows an example of an impurity concentration profile of the semiconductor device 1. An axis of abscissas in FIG. 3 is the film thickness direction from the collector region 10 toward the drift region 30 (the same applies below). An impurity concentration of a field stop region 20 of a semiconductor device of a comparative example is shown by a broken line S2 in FIG. 3. In a case where the impurity concentration gradient of the field stop region 20 is steep as in the broken line S2, the ringing occurs in the voltage rise waveform at the OFF time.

Meanwhile, the impurity concentration gradient in the film thickness direction of the field stop region 20 of the semiconductor device 1 is gentle as shown by a solid line S1 in FIG. 3. Therefore, the extension ratio of the depletion layer with respect to the voltage at the OFF time becomes gently small. As a result, in the semiconductor device 1, the ringing does not occur in the voltage rise waveform at the OFF time. Particularly, to the region of the field stop region 20, which is adjacent to the drift region 30, there extends the depletion layer from the drift region 30 at the OFF time, and accordingly, the impurity concentration gradient is set gentle in this region. In such a way, this embodiment is effective in gently reducing the extension ratio of the depletion layer with respect to the voltage. Therefore, the impurity concentration gradient of the field stop region 20 is set larger in the region adjacent to the, collector region 10 than in the region adjacent to the drift region 30.

Figure 4:
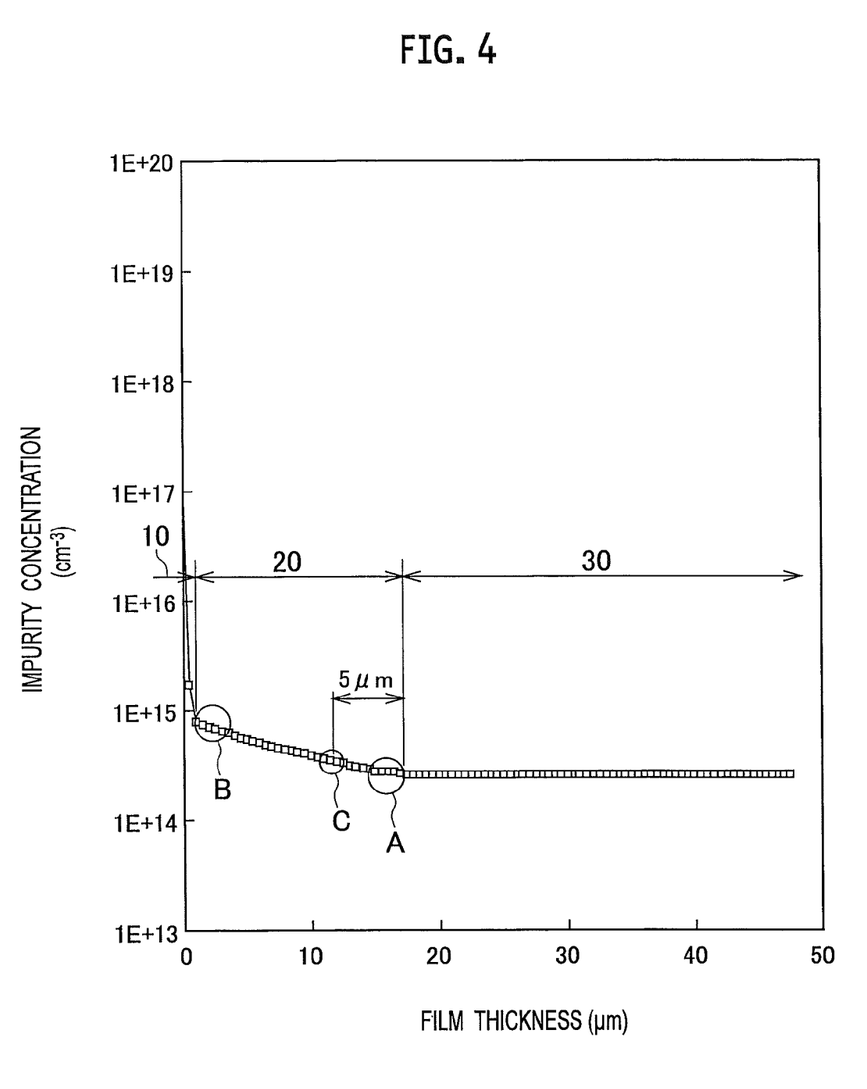
FIG. 4 is a schematic diagram showing an example of an impurity concentration of the semiconductor device according to the embodiment of the present invention.

FIG. 4 shows an example of the impurity concentration gradient of the field stop region 20. In the example shown in FIG. 4, an impurity concentration gradient per unit length is approximately $7 \times 10^{13}$ cm$^{-3}$/μm. Then, the impurity concentration gradient is larger in the region (region B in FIG. 4) adjacent to the collector region 10 than in the region (region A in FIG. 4) adjacent to the drift region 30.

As mentioned above, the impurity concentration gradient in the region A adjacent to the drift region 30 is set gentle so that the extension ratio of the depletion layer with respect to the voltage can be reduced gently. For example, preferably, a gradient of the impurity concentration of the field stop region 20 at a position (region C in FIG. 4) of 5 μm in the film thickness direction from an interface between the drift region 30 and the field stop region 20 is $1 \times 10^{14}$ cm$^{-3}$/μm or less.

As a result of the repeated examinations, the inventors of the present invention have found out that the ringing does not occur in the voltage rise waveform at the OFF time in the semiconductor device 1 that has the impurity concentration profile shown in FIG. 4.

Moreover, it is preferable that the gradient of the impurity concentration of the field stop region 20 is gradually increased from the region adjacent to the drift region 30 toward the region adjacent to the collector region 10. In such a way, the depletion layer can be prevented from reaching the collector region 10 while suppressing the occurrence of the ringing.

As described above, in the semiconductor device 1 according to the embodiment of the present invention, the impurity concentration gradient of the field stop region 20 is made gentle, whereby the extension ratio of the depletion layer with respect to the voltage is reduced gently. As a result, there can be provided the semiconductor device 1, which has the field stop region, and in which the occurrence of the ringing in the voltage rise waveform at the OFF time is suppressed.

By using FIG. 5 to FIG. 10, a description is made of a method for manufacturing the semiconductor device 1 according to the embodiment of the present invention. Note that such a manufacturing method described below is an example, and as a matter of course, the manufacturing method according to the present invention is realizable by other various manufacturing methods including modification examples thereof.

Figure 5:
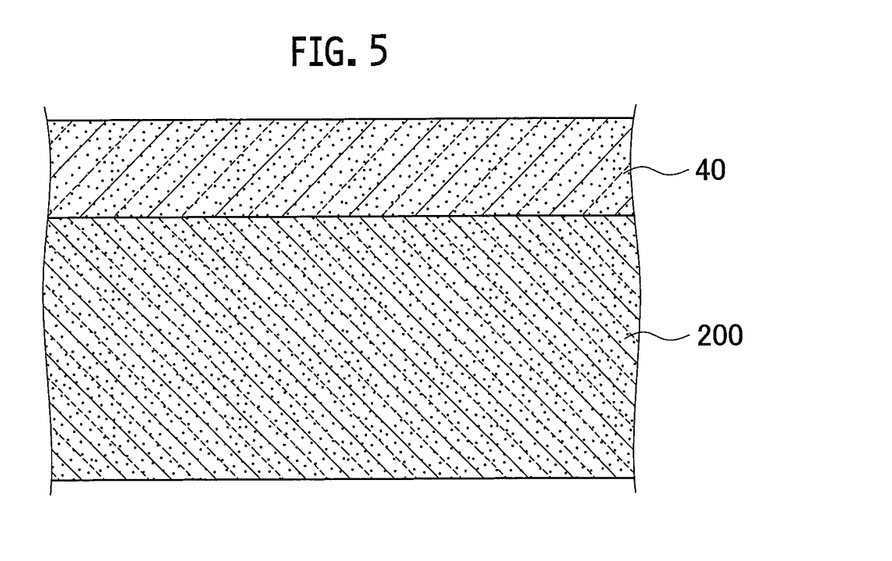
FIG. 5 is a schematic process cross-sectional view for explaining a manufacturing method of the semiconductor device according to the embodiment of the present invention (No. 1).
Figure 6:
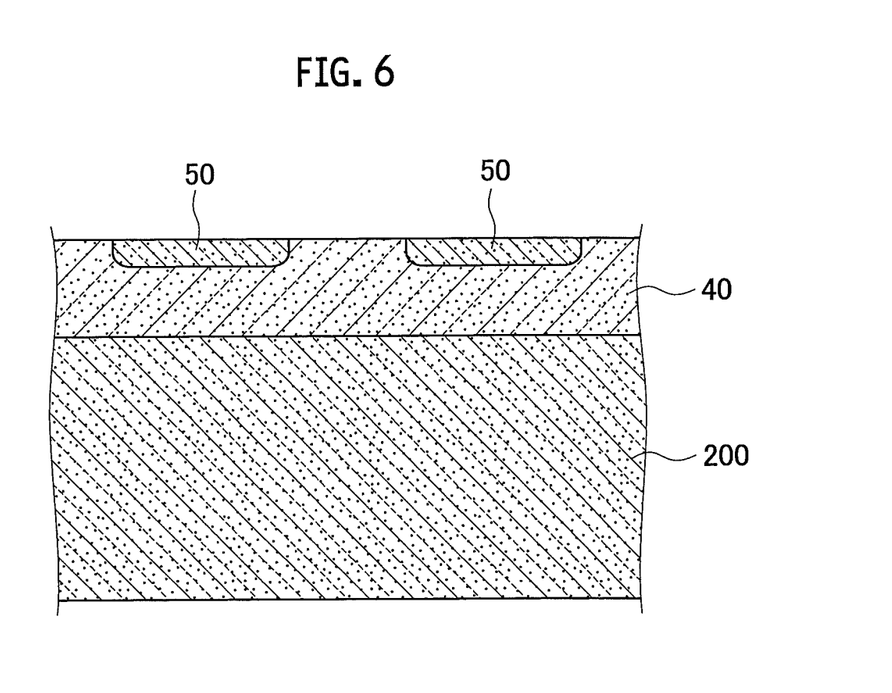
FIG. 6 is a schematic process cross-sectional view for explaining the manufacturing method of the semiconductor device according to the embodiment of the present invention (No. 2).

As shown in FIG. 5, the p-type base region 40 is formed on an n-type semiconductor substrate 200. For example, the base region 40 is formed by using the epitaxial growth method, or the ion implantation method and the diffusion. Subsequently, as shown in FIG. 6, the n$^+$-type emitter region 50 is selectively formed on a part of the upper surface of the base region 40, for example, by using the ion implantation method and the diffusion.

Figure 7:
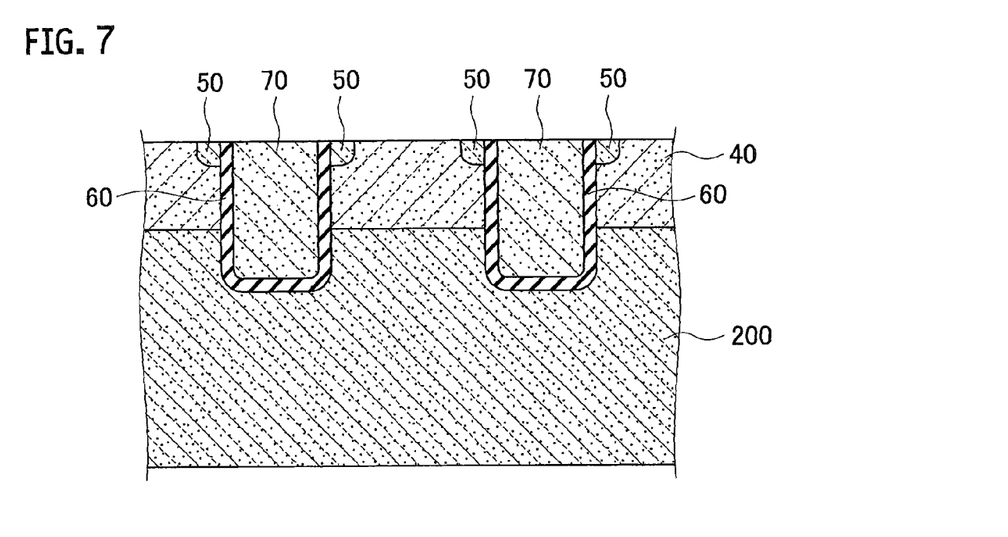
FIG. 7 is a schematic process cross-sectional view for explaining the manufacturing method of the semiconductor device according to the embodiment of the present invention (No. 3).

By using the photolithography technology and the etching technology, trenches are formed, which penetrate the emitter regions 50 and the base region 40 and allow tip ends thereof to reach the semiconductor substrate 200. Then, the gate insulating films 60 are formed on inner walls of the trenches. For example, silicon oxide (SiO$_2$) films are formed by the thermal oxidation method. Thereafter, polysilicon films added with impurities are embedded in insides of the trenches. Moreover, a surface of the base region 40 is planarized as shown in FIG. 7 by a polishing process such as chemical mechanical processing (CMP), whereby the gate electrodes 70 are formed.

Figure 8:
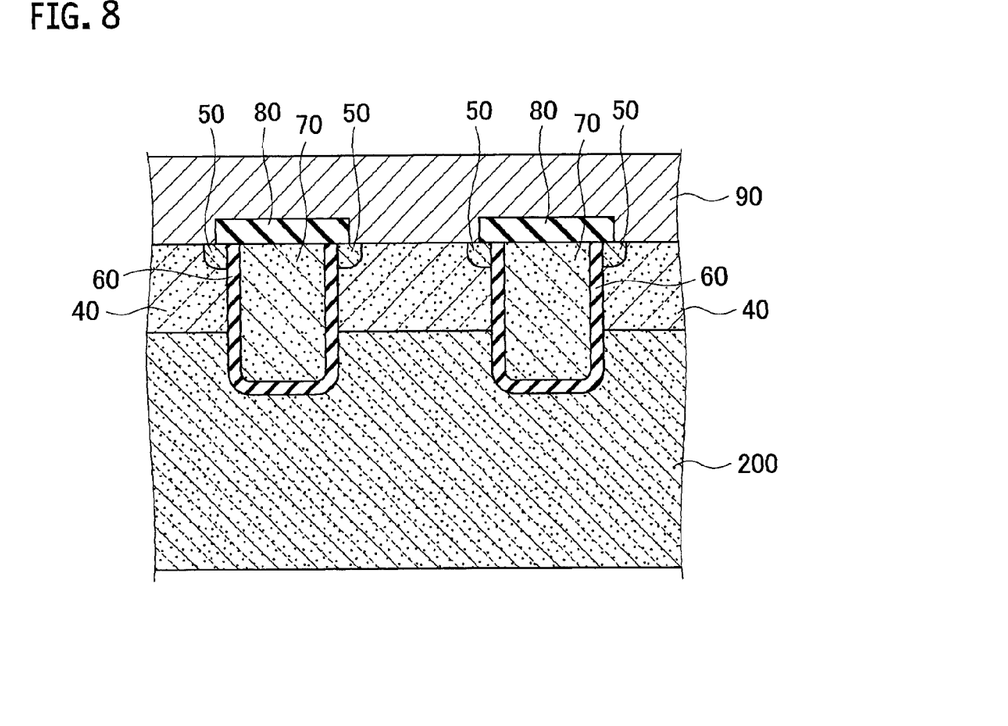
FIG. 8 is a schematic process cross-sectional view for explaining the manufacturing method of the semiconductor device according to the embodiment of the present invention (No. 4).

After the interlayer insulating films 80 are formed on the gate electrodes 70, the emitter electrode 90 that connects to the emitter regions 50 and the base region 40 is formed on the interlayer insulating films 80 as shown in FIG. 8.

Figure 9:
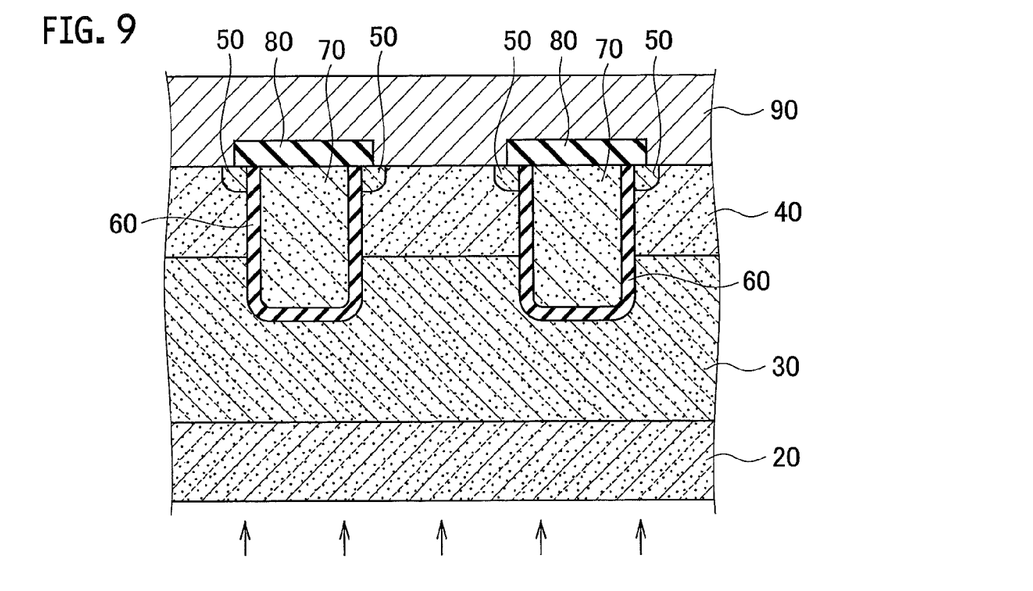
FIG. 9 is a schematic process cross-sectional view for explaining the manufacturing method of the semiconductor device according to the embodiment of the present invention (No. 5).

As shown by the arrows in FIG. 9, n-type impurities are implanted from a lower surface of the semiconductor substrate 200 into the semiconductor substrate 200, and the semiconductor substrate 200 is subjected to annealing. In such a way, the n-type field stop region 20 is formed on a lower surface side of the semiconductor substrate 200. A residual region in a region of the semiconductor substrate 200, in which the field stop region 20 is formed, is the drift region 30.

At this time, the impurity concentration gradient in the film thickness direction of the field stop region 20 is formed gently as described above. For example, the impurity concentration gradient per unit length is approximately $7 \times 10^{13}$ cm$^{-3}$/μm. Then, the field stop region 20 is formed so that the impurity concentration gradient is larger in the region adjacent to the collector region 10 than in the region adjacent to the drift region 30.

Figure 10:
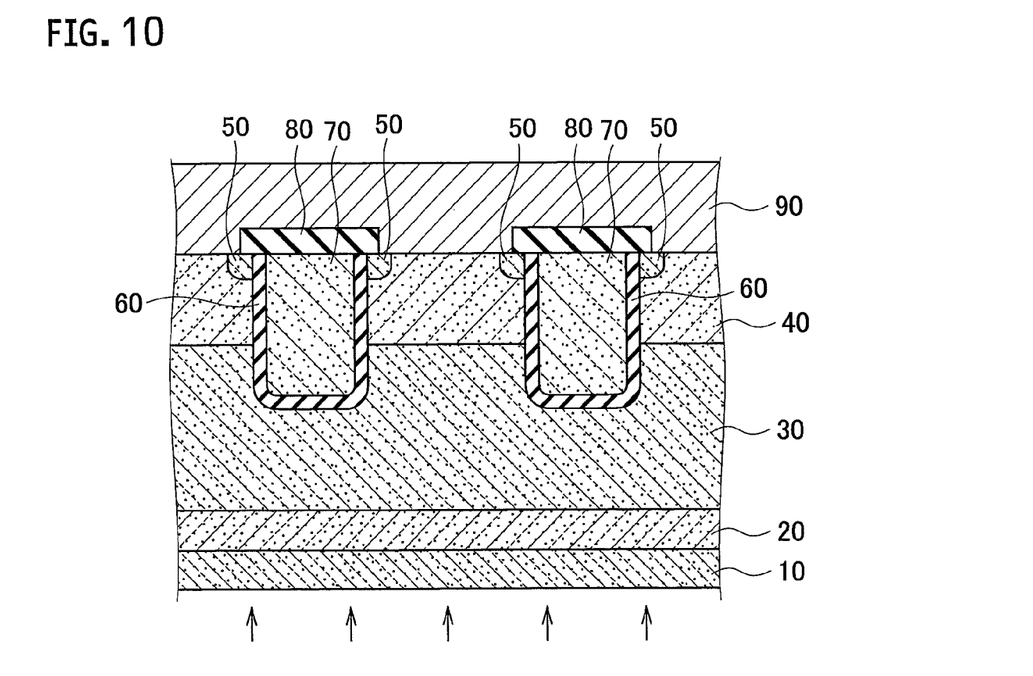
FIG. 10 is a schematic process cross-sectional view for explaining the manufacturing method of the semiconductor device according to the embodiment of the present invention (No. 6).

Subsequently, as shown by arrows in FIG. 10, p-type impurities are implanted from a lower surface of the field stop region 20, and the collector region 10 is formed. Thereafter, the collector electrode 95 is formed on the collector region 10, whereby the semiconductor device 1 shown in FIG. 1 is completed.

As described above, in accordance with the method for manufacturing the semiconductor device 1 according to the embodiment of the present invention, the semiconductor device, in which the impurity concentration gradient in the film thickness direction of the field stop region 20 is gentle, is manufactured. Particularly, the field stop region 20 is formed so that the impurity concentration gradient can be larger in the region adjacent to the collector region 10 than in the region adjacent to the drift region 30. Therefore, the semiconductor device 1 can be obtained in which the occurrence of the ringing in the voltage rise waveform at the OFF time is suppressed.

<First Modification Example>

Figure 11:
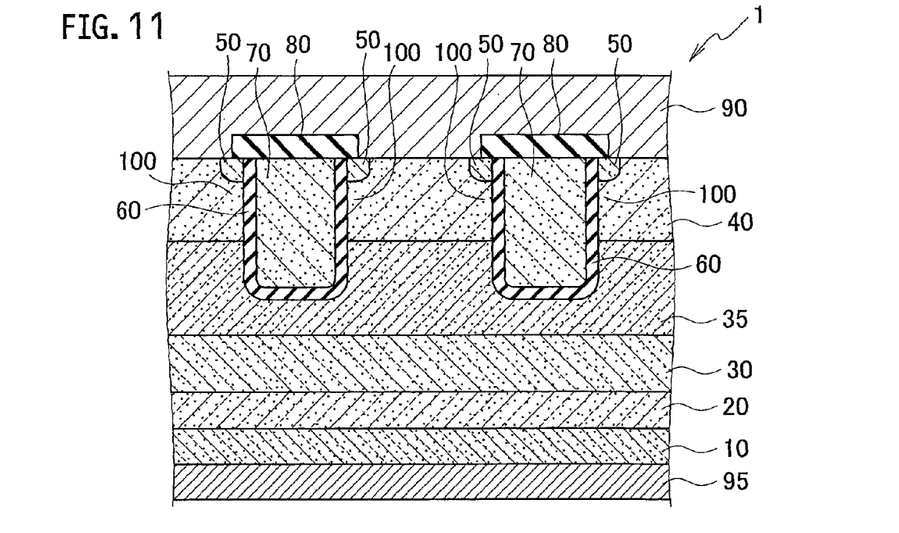
FIG. 11 is a schematic a cross-sectional view showing a structure of a semiconductor device according to a first modification example of the embodiment of the present invention.

As shown in FIG. 11, an n-type carrier accumulation region 35 having a higher impurity concentration than the drift region 30 may be disposed between the base region 40 and the drift region 30.

Figure 12:
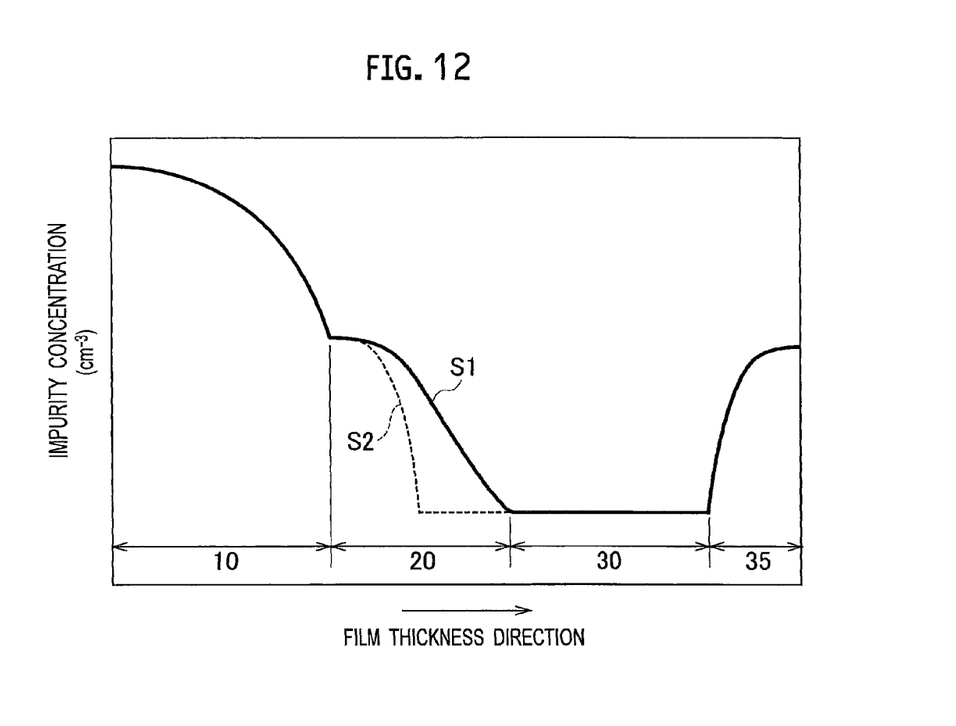
FIG. 12 is a schematic diagram showing an example of an impurity concentration profile of the semiconductor device according to the first modification example of the embodiment of the present invention.

FIG. 12 shows an example of an impurity concentration profile from the carrier accumulation region 35 to the collector region 10. Since the impurity concentration gradient in the film thickness direction of the field stop region 20 is gentle, the impurity concentration gradient in the film thickness direction of the field stop region 20 when viewed from the drift region 30 is smaller than the impurity concentration gradient in the film thickness direction of the carrier accumulation region 35 when viewed from the drift region 30.

By relatively increasing the impurity concentration gradient of the carrier accumulation region 35, the holes are accumulated in the drift region 30. The holes coming from the collector region 10 are inhibited from reaching the emitter regions 50, and the ON voltage of the semiconductor device 1 can be further reduced. Furthermore, the depletion layer quickly reaches the drift region 30 with a low impurity concentration from the carrier accumulation region 35, and accordingly, it can be easily made to spread the depletion layer. Therefore, a withstand voltage of the semiconductor device 1 can be enhanced.

Also in the semiconductor device 1 shown in FIG. 11, the impurity concentration gradient in the film thickness direction of the field stop region 20 when viewed from the drift region 30 is small, whereby the ringing of the voltage rise waveform is suppressed.

<Second Modification Example>

Figure 13:
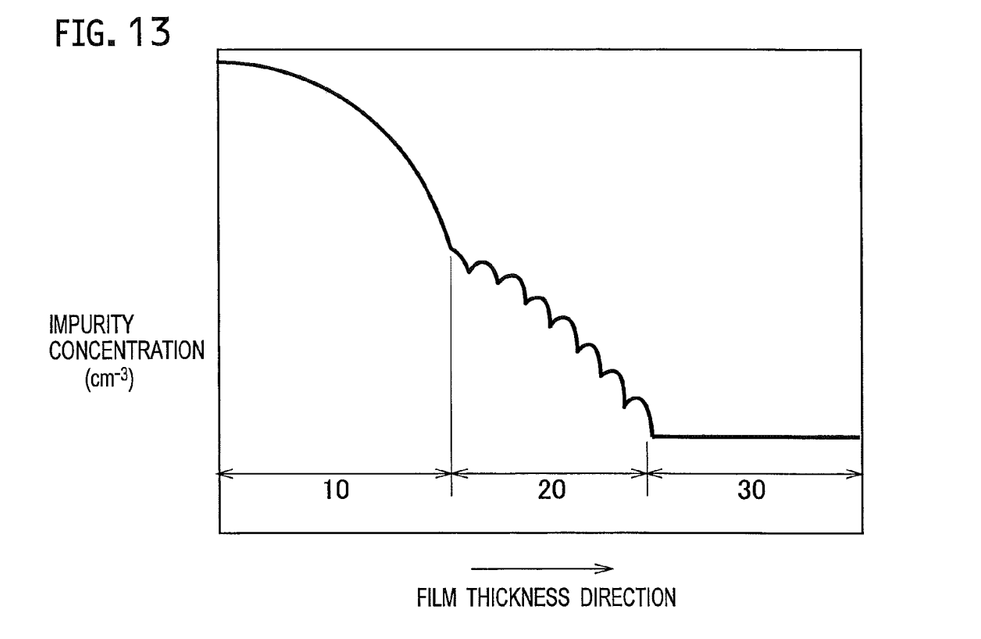
FIG. 13 is a schematic diagram showing an example of an impurity concentration profile of a semiconductor device according to a second modification example of the embodiment of the present invention.

In the above, there is shown the example where the gradient of the impurity concentration of the field stop region 20 is monotonically increased from the region adjacent to the drift region 30 toward the region adjacent to the collector region 10. However, as shown in FIG. 13, the impurity concentration of the field stop region 20 may be gradually increased from the drift region side to the collector region side while repeating the increase and the decrease. For example, the field stop region 20 is formed by ion implantation that is performed a plurality of times while changing implantation conditions, where by an impurity concentration profile shown in FIG. 13 is obtained.

Also in the impurity concentration profile shown in FIG. 13, the impurity concentration gradient in the film thickness direction of the field stop region 20 is formed gently as a whole, and for example, an average of the impurity concentration gradients per unit length becomes approximately $7 \times 10^{13}$ cm$^{-3}$/μm. Then, the field stop region 20 is formed so that the impurity concentration gradient can be larger in the region adjacent to the collector region 10 than in the region adjacent to the drift region 30. Moreover, it is preferable that the gradient of the impurity concentration of the field stop region 20 at the position of 5 μm in the film thickness direction from the interface between the drift region 30 and the field stop region 20 is $1 \times 10^{14}$ cm$^{-3}$/μm or less.

(Other Embodiments)

As above, the present invention has been described by the embodiment; however, it should not be understood that the description and the drawings, which form a part of this disclosure, limit the present invention. For those skilled in the art, varieties of alternative embodiments, examples and application technologies will be obvious from this disclosure.

For example, an n-type buffer region may be disposed between the field stop region 20 and the collector region 10. An impurity concentration of the buffer region is, for example, approximately $7 \times 10^{15}$ cm$^{-3}$. By the buffer region, there can be exerted an effect that the extension of the depletion layer can be surely stopped even in a case where the depletion layer attempts to extend beyond the field stop region 20.

Figure 14:
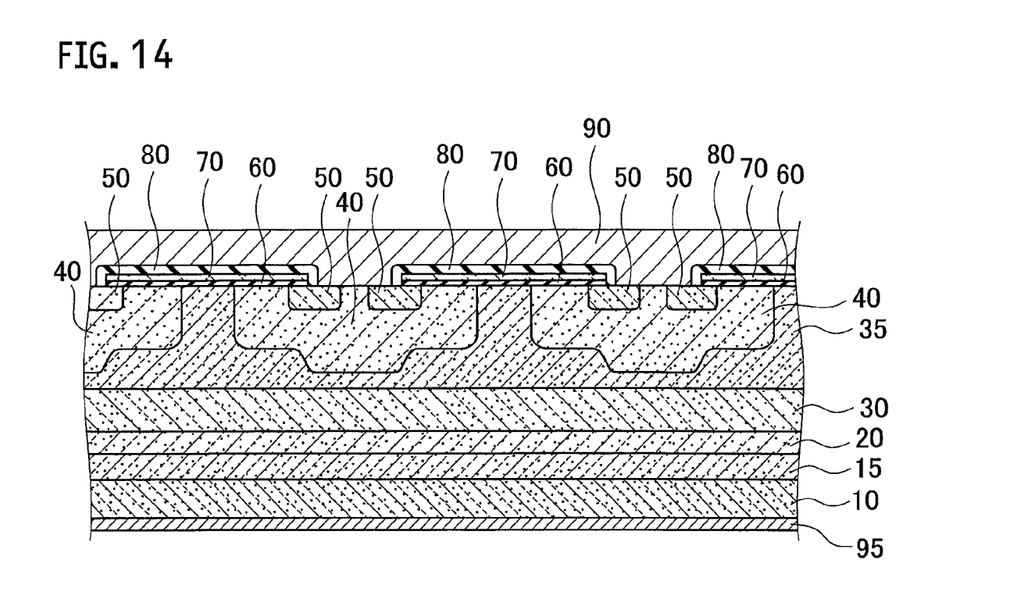
FIG. 14 is a cross-sectional view showing a structure of a semiconductor device according to another embodiment of the present invention.

Moreover, in the above description, the example is shown where the semiconductor device 1 has a trench gate structure. However, the present invention is also applicable to a case where the semiconductor device 1 has a planar structure. FIG. 14 shows an example of a semiconductor device 1 with the planar structure. In the semiconductor device 1 shown in FIG. 14, the gate electrodes 70 are arranged on the base regions 40 via the gate insulating films 60. The interlayer insulating films 80 are arranged between the gate electrodes 70 and the emitter electrode 90. Surfaces of the base regions 40 opposed to the gate electrodes 70 via the gate insulating films 60 are channel regions.

Also in the case of the semiconductor device 1 with the planar structure, which is shown in FIG. 14, the impurity concentration gradient in the film thickness direction of the field stop region 20 is set gentle, and is increased in the region on the collector region side than in the region on the drift region side. In such a way, the ringing can be suppressed from occurring in the voltage rise waveform. Note that, though FIG. 14 shows the example where the semiconductor device 1 has the carrier accumulation region 35 and the buffer region 15, either or both of the carrier accumulation region 35 and the buffer region 15 may be omitted.

As described above, it is a matter of course that the present invention incorporates varieties of embodiments and the like, which are not described herein. Hence, the technical scope of the present invention is defined only by items specifying the invention, which are according to the scope of claims reasonable based on the above description.

INDUSTRIAL APPLICABILITY

The semiconductor device of the present invention is usable for the purpose of the semiconductor device having the field stop region.

The invention claimed is:

1. A semiconductor device comprising:
   a first conductivity-type collector region;
   a second conductivity-type field stop region disposed on the collector region;
   a second conductivity-type drift region, which is disposed on the field stop region and has an impurity concentration lower than the field stop region;
   a first conductivity-type base region disposed on the drift region;
   a second conductivity-type emitter region disposed on the base region;
   a gate insulating film disposed between the drift region and the emitter region so as to face to the base region;
   a gate electrode disposed via the gate insulating film so as to be opposed to the base region; and
   a second conductivity-type carrier accumulation region disposed between the base region and the drift region, the carrier accumulation region having an impurity concentration higher than the drift region, the carrier accumulation region being in contact with the base region,
   wherein an impurity concentration gradient in a film thickness direction of the field stop region is larger in a region adjacent to the collector region than in a region adjacent to the drift region, and wherein the impurity concentration gradient of the field stop region is smaller than an impurity concentration gradient in the film thickness direction of the carrier accumulation region.

2. The semiconductor device according to claim 1, wherein the impurity concentration gradient of the field stop region is gradually increased from the region adjacent to the drift region toward the region adjacent to the collector region.

3. The semiconductor device according to claim 1, wherein the impurity concentration gradient of the field stop region at a position of 5 μm in the film thickness direction from an interface between the drift region and the field stop region is $1 \times 10^{14}$ cm$^{-3}$/μm or less.

4. The semiconductor device according to claim 1,
wherein a trench is formed, the trench extending from an upper surface of the emitter region, and penetrating at least the emitter region and the base region,
the gate insulating film is disposed on an inner wall of the trench, and
the gate electrode is embedded in an inside of the trench via the gate insulating film.

\* \* \* \* \*